United States Patent [19]

Nippert

[11] Patent Number: 4,607,514

[45] Date of Patent: Aug. 26, 1986

[54] METHOD OF FORMING A METAL PART HAVING AN ANNULAR FLANGE

[75] Inventor: Russell A. Nippert, Columbus, Ohio

[73] Assignee: The Nippert Company, Delaware, Ohio

[21] Appl. No.: 607,856

[22] Filed: May 7, 1984

[51] Int. Cl.$^4$ .............................................. B21D 22/00
[52] U.S. Cl. ........................................ 72/354; 72/359
[58] Field of Search ................... 72/354, 356, 359, 360

[56] References Cited

U.S. PATENT DOCUMENTS

| | | | |
|---|---|---|---|
| 3,124,876 | 3/1964 | Putetti | 72/356 X |
| 3,434,326 | 3/1969 | Serret | 72/354 |
| 3,675,459 | 7/1972 | Dohmann | 72/359 X |
| 4,177,665 | 12/1979 | Schurmann | 72/359 |
| 4,377,085 | 3/1983 | McDermott et al. | 72/359 |

FOREIGN PATENT DOCUMENTS 717163 10/1954 United Kingdom ................ 72/359

Primary Examiner—Francis S. Husar
Assistant Examiner—Steve Katz
Attorney, Agent, or Firm—Killworth, Gottman, Hagan & Schaeff

[57] ABSTRACT

A pill-shaped billet which is tapered in thickness toward an outer, relatively thin rim, extending circumferentially therearound, is cold formed into a metal part having an annular flange. Upper and lower die elements define cavities, and shoulders extending circumferentially therearound, and are positioned in a sleeve with the shoulders being directly opposed, thereby defining an annular space. The billet is placed between the upper and lower die elements in the sleeve with the rim of the billet in the annular space. The upper and lower die elements contact the billet only along the edges between their respective shoulders and cavities. When the upper and lower die elements are moved toward each other, the annular flange is formed by extruding radially outward the part of the billet between the shoulders, while simultaneously cold forming the billet into the first and second cavities.

4 Claims, 8 Drawing Figures

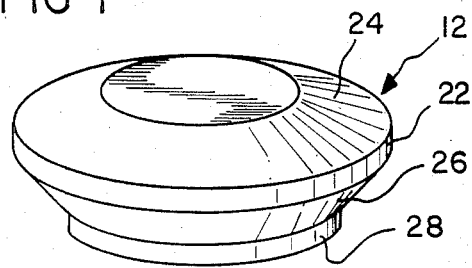
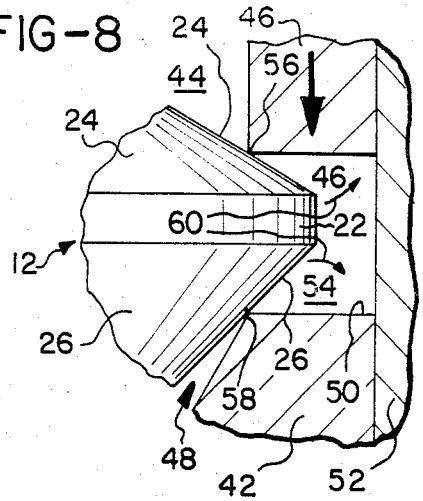
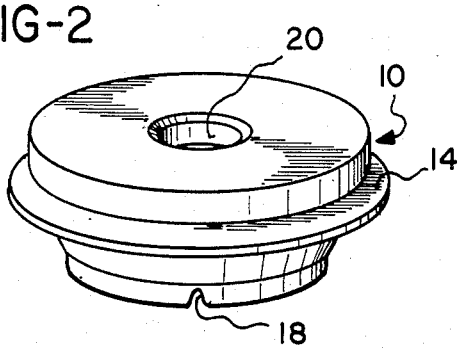
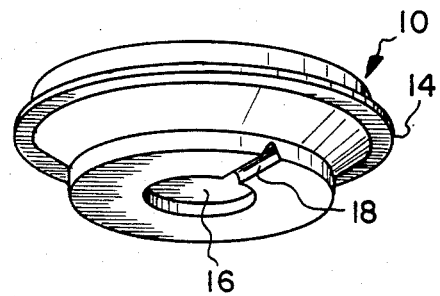

METHOD OF FORMING A METAL PART HAVING AN ANNULAR FLANGE

BACKGROUND OF THE INVENTION

The present invention relates to a method of forming a metal part and, more particularly, to a method of forming a metal part having an annular flange by a radial extrusion process.

A number of different types of metal parts, such as for example the generally disk-shaped copper contacts which form a part of some semi-conductor devices, require an annular flange. Due to the difficulty in forming the flange structure at the same time that the copper contact is cold worked, such flanges have been formed separately in the past and then brazed to the copper contacts. Although some attempts to form a disk-shaped contact and a radially extending annular flange in a single operation have been attempted in the past, these attempts have been largely unsuccessful. Using prior art techniques, the metal flow has produced large forces on the upper and lower die parts, causing an unacceptably high incidence of die failure. As a consequence, it has not been practical to extrude such annular flange elements due to the friction forces applied to the die surfaces as the metal billet is worked.

Accordingly, it is seen that there is a need for a reliable, economical method for forming an annular flange on a metal part at the same time that the part is cold formed, without stressing the die parts sufficiently to produce die breakage.

SUMMARY OF THE INVENTION

A method according to the present invention for forming a metal part having an annular flange includes the steps of providing a metal billet having an upper, truncated frusto-conical portion, increasing in diameter downward and a lower, truncated frusto-conical portion directly beneath the upper frusto-conical portion, increasing in diameter upward. In this method, upper and lower die elements are provided for relative movement axially toward and away from one another. The upper die element defines a first cavity and a first outer shoulder extending circumferentially therearound. The first outer shoulder has an inner diameter less than the maximum diameter of the upper and lower portions of the billet. The first outer shoulder has an outer diameter greater than the maximum diameter of the upper and lower portions of the billet. The lower die element defines a second cavity and a second outer shoulder extending circumferentially therearound. The second outer shoulder has inner and outer diameters substantially equal to the inner and outer diameters, respectively, of the first outer shoulder.

A sleeve is provided for receiving the upper and lower die elements. The sleeve has an inner diameter substantially equal to the outer diameter of the first and second outer shoulders. The upper and lower die elements are positioned in the sleeve with the first and second outer shoulders in direct opposition so as to define an annular space.

The method further includes the step of placing the billet in the sleeve between the upper and lower die elements such that the parts of the upper and lower portions of greatest diameter extend into the annular space. The edge between the first outer shoulder and the first cavity contacts the upper frusto-conical portion along a line extending circumferentially therearound. The edge between the second outer shoulder and the second cavity contacts the lower portion along a line extending circumferentially therearound. Finally, the method includes the step of causing relative movement of the upper and lower die elements toward each other, whereby the part of the metal billet extending into the annular space is extruded radially outward to form the flange.

The step of placing the billet in the sleeve may include the step of positioning the billet such that the surface of the billet does not contact either the first or second outer shoulders, whereby radial extrusion of the annular flange is facilitated due to reduction of the friction between the extruded material, and the first and second shoulders. The step of providing upper and lower die elements may include the step of providing a central pedestal in the bottom of the second cavity and a raised rib extending radially outward from the central pedestal, whereby the movement of the upper and lower die elements toward each other produces cold forming of the billet into the second cavity and formation of a central recess and slot extending radially outward on one side of the metal part. The step of providing the upper and lower die elements may include the step of providing a central pedestal in the top of the first cavity, whereby the movement of the upper and lower die elements toward each other produces cold forming of the billet into the first cavity and formation of a central recess on a side of the metal part.

The method of forming a metal part having an annular flange may include the steps of:

(a). providing a pill-shaped billet which is tapered in thickness toward an outer, relatively thin rim which extends circumferentially therearound;

(b). providing upper and lower die elements for axial movement toward and away from each other, the upper die element defining a first cavity and a first shoulder extending circumferentially therearound, and the lower die element defining a second cavity and a second shoulder extending circumferentially therearound;

(c). providing a sleeve for receiving the upper and lower die elements, with the first and second shoulders being directly opposing to define therebetween an annular space;

(d). placing the billet between the upper and lower die elements in the sleeve with the rim in the annular space, and the upper and lower die elements only contacting the billet along the edge between the first cavity and the first shoulder and along the edge between the second cavity and the second shoulder; and (e). moving the upper and lower die elements toward each other and thereby extruding radially outwardly the part of the billet between the shoulders to form the annular flange while simultaneously cold forming the billet into the first and second cavities.

The first and second shoulders may be substantially equal in their inner and outer diameters. The outer diameter of the first and second shoulders may be substantially equal to the inner diameter of the sleeve. The outer diameter of the billet is less than the inner diameter of the sleeve.

The step of providing upper and lower die elements may include the step of providing a central pedestal in the bottom of the second cavity, whereby the movement of the upper and lower die elements toward each other forms a central recess on one side of the metal part. The step of providing upper and lower die elements may include the step of providing a raised rib in the bottom of the second cavity extending radially outward from the central pedestal. The movement of the upper and lower die elements toward each other forms a slot extending radially outward from the recess on one side of the metal part.

Accordingly, it is an object of the present invention to provide a method of forming a metal part having an annular flange, in which the flange is extruded radially outwardly from a billet without substantial risk of die failure; to provide such a method in which frictional forces between the radially flowing metal and the die surfaces are minimized; and to provide such a method in which extrusion is accomplished at relatively low pressures and the metal part is formed without the requirement for subsequent machining or forming operations.

BRIEF DESCRIPTION OF THE DRAWINGS

FIG. 1 is a perspective view of a metal billet of the type used in the method of the present invention;

FIGS. 2 and 3 are perspective views of a metal part of the type formed, according to the present invention, from the billet of FIG. 1;

FIG. 8 is an enlarged sectional view, partially in section, of the billet and the opposing shoulders of the die elements, illustrating radial extrusion to produce an annular flange according to the present invention.

DETAILED DESCRIPTION OF THE PREFERRED EMBODIMENTS

Figure 4:
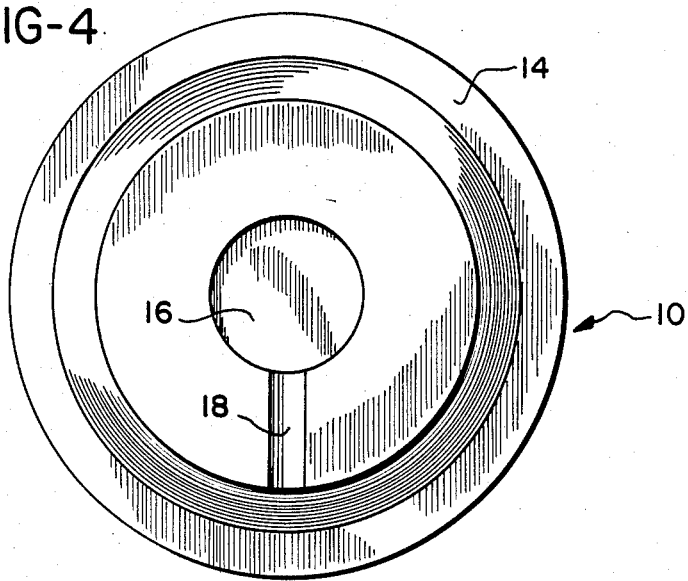
FIG. 4 is a bottom elevation view of the metal part of FIGS. 2 and 3.

The present invention is directed to a method of forming a metal part 10, such as shown in FIGS. 2–4, from a metal billet 12, of the type shown in FIG. 1. The metal part 10 includes an annular flange 14 which extends circumferentially therearound. Typically the metal billet 12 is made of a material, such as copper or a copper alloy, which is capable of being extruded and cold formed in a die. The metal part 10 is formed from the billet 12 in a single operation which simultaneously produces a central recess 16 and a slot 18 extending outward from the central recess on one side of the metal part. Additionally, another central recess 20 is formed on the other side of the metal part 10 in the same forming operation.

The metal billet 12, as seen in FIG. 1, is generally pill-shaped, that is, it is tapered in thickness toward an outer, relatively thin rim 22 which extends circumferentially therearound. The billet 12 has an upper, frusto-conical portion 24 increasing in diameter downward. The billet 12 also has a lower, frusto-conical portion 26 increasing in diameter upward. Billet 12 further includes a lower, generally cylindrical portion 28.

Figure 5:
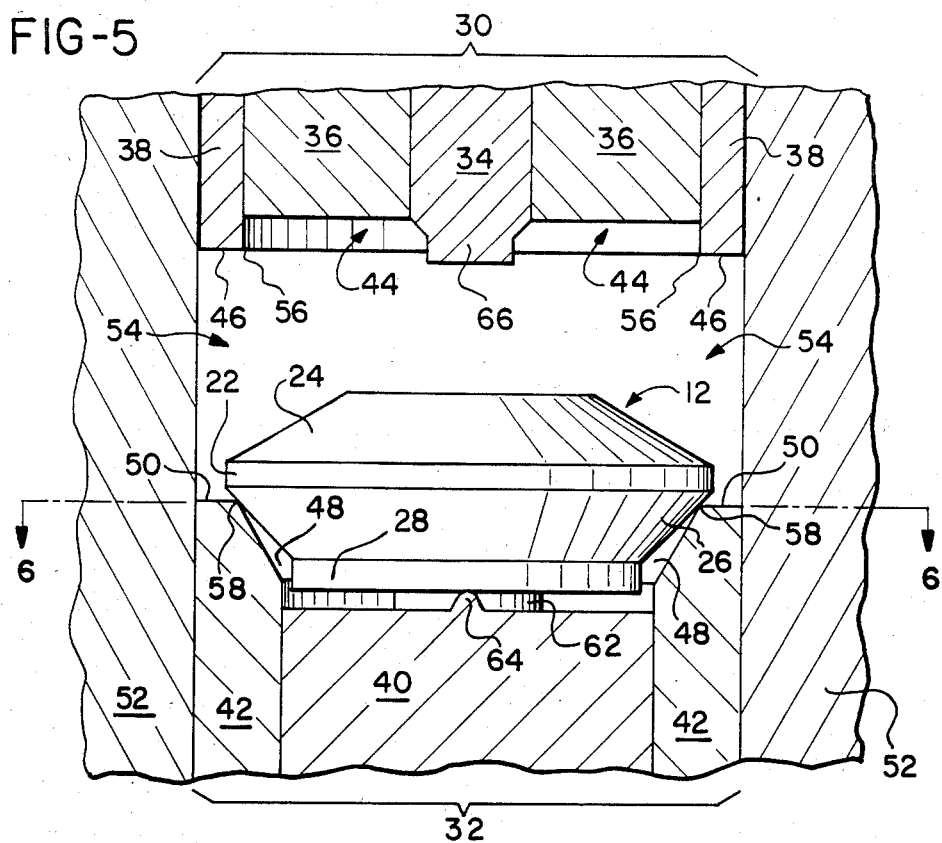
FIG. 5 is a sectional view showing the billet of FIG. 1, positioned within a sleeve between first and second die elements.

According to the invention, an upper die element 30 and a lower die element 32, as depicted in FIG. 5, are provided for relative axial movement toward and away from one another. Upper die element 30 includes a central post 34 and concentric members 36 and 38. Post 34, and members 36 and 38 are fixed together and move as a single die element. Similarly, a lower die element 32 includes a central member 40 and concentric member 42 which are fixed together and which act as a single die element.

Figure 6:
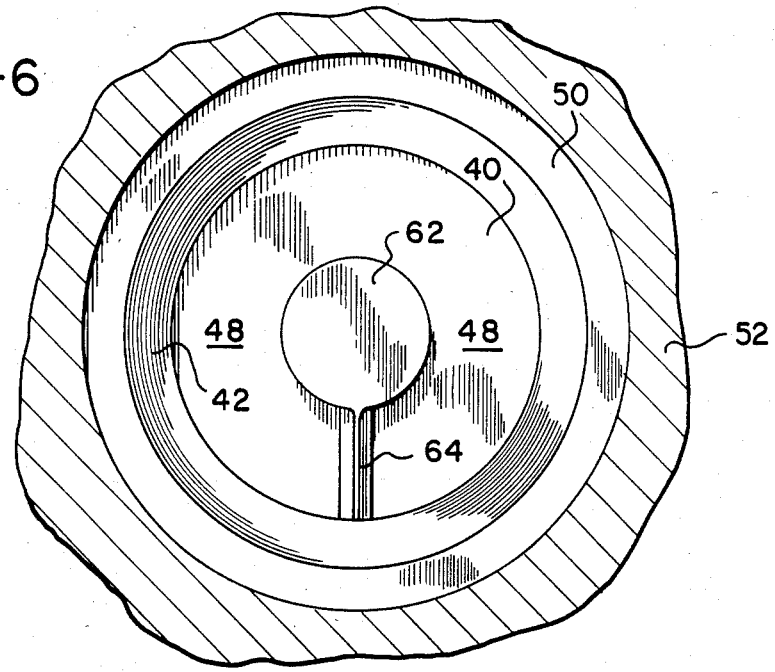
FIG. 6 is a plan sectional view of the lower die element of FIG. 5, taken generally along line 6—6 in FIG. 5.

The upper die element 30 defines a first cavity 44 and a first outer shoulder 46 extending circumferentially around the cavity 44. The first outer shoulder 46 has an inner diameter less than the maximum diameter of the upper and lower portions 24 and 26 of the billet 12. The shoulder 46 has an outer diameter greater than the maximum diameter of the upper and lower portions 24 and 26 of the billet 12. Similarly, lower die element 32 defines a second cavity 48 and a second outer shoulder 50 extending circumferentially around the second cavity 48, as illustrated in FIG. 6. The second, outer shoulder 50 has inner and outer diameters substantially equal to the inner and outer diameters, respectively, of the first outer shoulder 46. A sleeve 52 is provided for receiving the upper die element 30 and the lower die element 32. Sleeve 52 has an inner diameter substantially equal to the outer diameter of the first and second outer shoulders 46 and 50. The upper die element 30 and the lower die element 32 are positioned in the sleeve as shown in FIG. 5 with the first and second outer shoulders 46 and 50 in direct opposition whereby shoulders 46 and 50 and sleeve 52 define an annular space 54.

The billet 12 is placed in the sleeve 52 between the upper die element 30 and the lower die element 32, as shown in FIG. 5, such that the parts of the upper and lower portions 24 and 26 of greatest diameter, as well as the rim 22, extend into the annular space 54. As shown best in FIG. 8, the edge 56 between the first outer shoulder 46 and the first cavity 44 contacts the upper frusto-conical portion 24 along a line extending circumferentially around portion 24. The edge 58 between the second outer shoulder 50 and the second cavity 48 contacts the lower frusto-conical portion 26 along a line extending circumferentially around portion 26.

Figure 7:
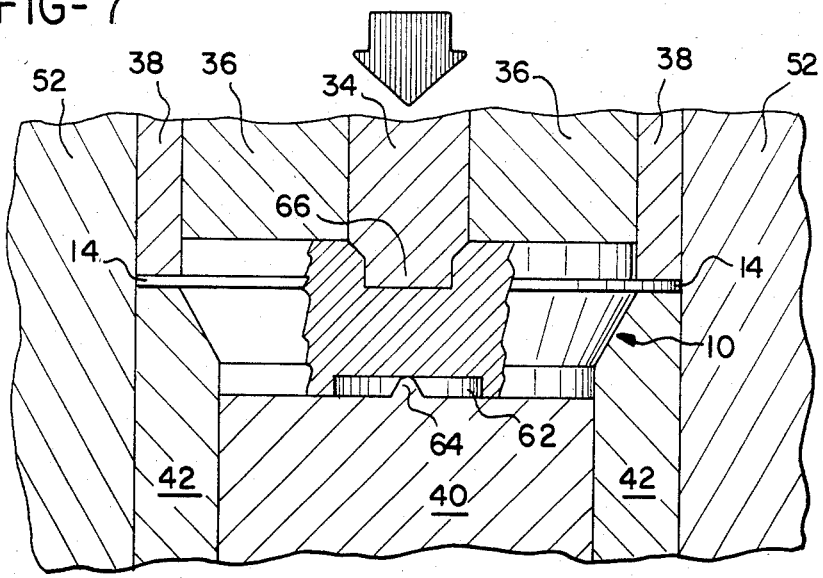
FIG. 7 is a sectional view, similar to FIG. 5, with a portion of the metal part broken away, illustrating the movement of the die elements to produce the metal part.

As shown in FIGS. 7 and 8, relative movement of the upper and lower die elements toward each other may be provided by moving upper die element 30 downward. As a consequence, the metal part 10 is formed and the part of the metal billet 12 extending into annular space 54 is extruded radially outward as indicated by arrows 60 in FIG. 8 to form the flange 14.

Simultaneously with the radially outward extrusion of the annular flange 14, the billet 12 is cold formed into the first and second cavities 44 and 48, so as to form the metal part 10 from billet 12 in a single forming operation. It will be appreciated that although sleeve 52 and lower die element 32 are illustrated as stationary and upper die element 30 is illustrated as being axially moveable, upper die element 30 could be held stationary with relative movement between the die elements being accomplished by axial movement of lower die element 32.

As is clear in FIG. 8, since the portion of the billet 12 from which the annular flange 14 is to be extruded is generally pill-shaped, that is, tapered in thickness outwardly toward a circumferential rim, the shoulders 46 and 50 do not contact the billet at the initiation of the radial extrusion flow 60. As a consequence, the extruding material does not apply an outward force to surfaces 46 and 50 by virtue of the sliding friction produced by the movement of the metal to the surfaces 46 and 50. The forming force which must be applied to the die element 30, therefore, is less than would be the case if a billet of a different shape were utilized. As a consequence, the stress applied to the die elements is reduced and breakage of these elements is materially reduced.

At the same time that the annular flange 14 is being radially extruded, the central recess 16 and slot 18 are being formed on the bottom side of the part 10. The lower die element 32 defines a central pedestal 62 in the bottom of second cavity 48 and a raised rib 64 extending radially outward from the central pedestal 62, as shown best in FIG. 6. The movement of the upper and lower die elements 30 and 32 toward each other produces cold forming of the billet 10 into the second cavity 48 and formation of the central recess 16 and the slot 18 extending radially outward.

In like fashion, central pedestal 66 is provided in the top of the first cavity 44. The movement of the upper and lower die elements 30 and 32 toward each other produces cold forming of the billet into the first cavity 44 and formation of the central recess 20 on the top side of the metal part 10. Thus, it is seen that the metal part 10 produced in this one operation requires virtually no further manufacturing processes. There is very little scrap produced and none of the billet material is wasted in needless subsequent machining operations.

It will be appreciated that the references made above to the top side and the bottom side of the metal part 10 and the references made above to the upper and lower die elements are presented simply for clarity in explanation of relative part positions and are not intended to be taken as absolute.

While the methods herein decribed constitute preferred embodiments of this invention, it is to be understood that the invention is not limited to these precise methods and that changes may be made therein without departing from the scope of the invention, which is defined in the appended claims.

What is claimed is:

1. A method of forming a metal part having an annular flange, comprising the steps of:
   providing a metal billet having an upper, frusto-conical portion, increasing in diameter downward, and a lower, frusto-conical portion directly beneath said upper frusto-conical portion, increasing in diameter upward,
   providing upper and lower die elements for relative movement axially toward and away from one another, said upper die element defining a first cavity and a first outer shoulder extending circumferentially therearound, said first outer shoulder having an inner diameter less than the maximum diameter and greater than the minimum diameter of said frusto-conical portions of said upper and lower portions of said billet and having an outer diameter greater than the maximum diameter of said upper and lower portions of said billet, said lower die element defining a second cavity and a second outer shoulder extending circumferentially therearound, said second outer shoulder having inner and outer diameters substantially equal to the inner and outer diameters, respectively, of said first outer shoulder,
   providing a sleeve for receiving said upper and lower die elements, said sleeve having an inner diameter substantially equal to said outer diameter of said first and second outer shoulders, said upper and lower die elements being positioned in said sleeve with said first and second outer shoulders in direct opposition whereby said first and second outer shoulders and said sleeve define an annular space,
   placing said billet in said sleeve between said upper and lower die elements such that the parts of said upper and lower portions of greatest diameter extend into said annular space, the edge between said first outer shoulder and said first cavity contacting said upper frusto-conical portion along a line extending circumferentially therearound, and the edge between said second outer shoulder and said second cavity contacting said lower frusto-conical portion along a line extending circumferentially therearound, and
   causing relative movement of said upper and lower die elements toward each other, whereby the part of said metal billet extending into said annular space is extruded radially outward to form said flange.

2. The method of claim 1, in which the step of placing said billet in said sleeve includes the step of positioning said billet such that the surface of said billet does not contact either said first or said second outer shoulders, whereby radial extrusion of said annular flange is facilitated due to reduction in friction between the extruded material and said first and second shoulders.

3. The method of claim 1 in which the step of providing upper and lower die elements includes the step of providing a central pedestal in the bottom of said second cavity and a raised rib extending radially outward from said central pedestal, whereby the movement of said upper and lower die elements toward each other produces cold forming of said billet into said second cavity and formation of a central recess and slot extending radially outward on one side of said metal part.

4. The method of claim 3 in which said step of providing said upper and lower die elements includes the step of providing a central pedestal in the top of said first cavity, whereby the movement of said upper and lower die elements toward each other produces cold forming of said billet into said first cavity and formation of a central recess on a side of said metal part.

* * * * *